(12) United States Patent
Lin

(10) Patent No.: US 11,881,140 B1
(45) Date of Patent: Jan. 23, 2024

(54) DISPLAY PANEL

(71) Applicant: AUO Corporation, Hsinchu (TW)

(72) Inventor: Cheng-Hsing Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/090,465

(22) Filed: Dec. 28, 2022

(30) Foreign Application Priority Data

Dec. 22, 2022 (TW) .................................. 111149456

(51) Int. Cl.
  *G09G 5/00* (2006.01)
  *G09G 3/20* (2006.01)
  *G11C 19/28* (2006.01)

(52) U.S. Cl.
  CPC .............. *G09G 3/20* (2013.01); *G11C 19/28* (2013.01); *G09G 2310/0267* (2013.01); *G09G 2310/0286* (2013.01); *G09G 2310/06* (2013.01)

(58) Field of Classification Search
  CPC ............. G09G 3/20; G09G 2310/0267; G09G 2310/0286; G09G 2310/06; G11C 19/28

USPC ........................................................ 345/204
See application file for complete search history.

(56) References Cited

U.S. PATENT DOCUMENTS

| | | | | |
|---|---|---|---|---|
| 2018/0293956 A1* | 10/2018 | Yao | ....................... | G11C 19/287 |
| 2019/0333901 A1 | 10/2019 | Cok et al. | | |
| 2021/0217353 A1* | 7/2021 | Zhao | ..................... | H01L 27/124 |
| 2023/0086927 A1* | 3/2023 | Han | ..................... | G09G 3/3266 |

* cited by examiner

*Primary Examiner* — Jennifer T Nguyen
(74) *Attorney, Agent, or Firm* — JCIPRNET

(57) ABSTRACT

A display panel is provided. The display panel includes a display array and a plurality of shift registers. The display array is disposed in an active region. The shift registers are disposed in the active region, and configured to drive the display panel. Each shift register is divided into a plurality of sub-circuits including a first sub-circuit and a second sub-circuit. The first sub-circuit is disposed in a first column of the display array. All first sub-circuits disposed in the first column are coupled to at least one global signal line. The second sub-circuit is disposed in a second column of the display array. The second sub-circuit disposed in the second column are serially coupled as at least one string through a plurality of jump signal lines.

10 Claims, 6 Drawing Sheets

DISPLAY PANEL

CROSS-REFERENCE TO RELATED APPLICATION

This application claims the priority benefit of Taiwan application serial no. 111149456, filed on Dec. 22, 2022. The entirety of the above-mentioned patent application is hereby incorporated by reference herein and made a part of this specification.

BACKGROUND

Technical Field

The disclosure relates to a panel, and in particular relates to a display panel.

Description of Related Art

In response to the design of narrow bezel or bezel-less displays, most of the displays today adopt the method of disposing the driving circuits in the active region of the display panel to reduce the bezel size. Since the area of the circuits disposed in the active region is related to the display quality of the display, how to balance the display quality with the requirement of reducing the bezel size has become an important issue in the design of displays today.

SUMMARY

The disclosure provides a display panel, which may be applied to display sizes with narrow bezels or no bezel, while taking into account the display quality.

The display panel of the disclosure includes a display array and multiple of shift registers. The display array is disposed in an active region. The shift registers are disposed in the active region, and configured to drive the display panel. Each shift register is divided into multiple sub-circuits. Each shift register includes a first sub-circuit and a second sub-circuit. The first sub-circuit is disposed in a first column of the display array, and all of the first sub-circuits disposed in the first column are coupled to at least one global signal line. The second sub-circuit is disposed in a second column of the display array, and all of the second sub-circuits disposed in the second column are serially connected as at least one string through multiple jump signal lines.

Based on the above, the sub-circuits on the same column may be connected through the same type of signal lines, so that these shift registers may use simpler and fewer lines and pins, reducing design complexity and saving manufacturing costs.

DETAILED DESCRIPTION OF DISCLOSED EMBODIMENTS

Figure 1:
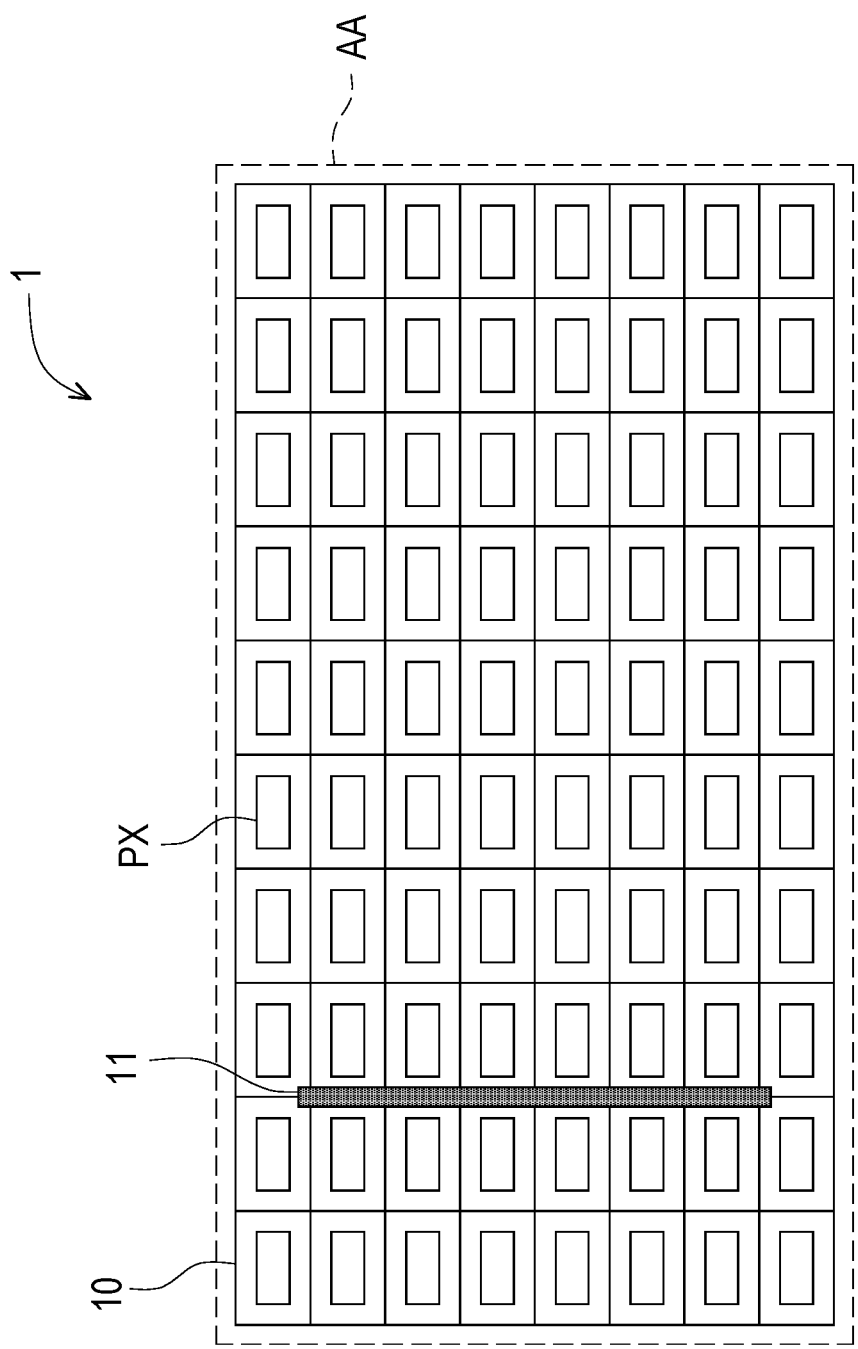
FIG. 1 is a schematic diagram of a display panel according to an embodiment of the disclosure.

FIG. 1 is a schematic diagram of a display panel 1 according to an embodiment of the disclosure. The display panel 1 includes a display array 10 and a row driving circuit 11. The display array 10 includes multiple pixel circuits PX, and these pixel circuits PX are disposed in columns and rows to form the display array 10 for displaying. On the other hand, the pixel circuit PX is disposed in the active region AA. The active region AA is actually the display region of the display panel 1, and the display panel 1 may display images in the region for users to watch. Furthermore, the row driving circuit 11 is also disposed in the active region AA and extends along the column direction. The row driving circuit 11 is configured to drive each row of the display array 10. Although not explicitly shown in FIG. 1, the row driving circuit 11 is actually formed by serially connecting multiple shift registers, and each shift register corresponds to each row of the display array 10, and is configured to provide driving signals to each row of the display array 10.

In detail, FIG. 1 is illustrates that the driving circuit 11 is disposed in the active region AA of the display panel 1 and extends along the column direction of the display array 10 across all rows of the display array 10. In an embodiment, the shift register in the driving circuit 11 may be divided into multiple sub-circuits, which are respectively disposed on different columns. More specifically, the transistors inside the shift register may be split into multiple sub-circuits according to the types of signal lines coupled, so that the types of signal lines coupled to each sub-circuit are different and not repeated. Also, for all the shift registers, the sub-circuits coupled to the same signal line may be disposed on the same column. For example, the shift register may be divided into a first sub-circuit coupled to the power rail and a second sub-circuit coupled to the output signal line. The power rail provided to the driving circuit 11 only needs to be configured to the column that the first sub-circuit is disposed on, thereby effectively reducing the number of signal lines required by the driving circuit 11, further reducing the manufacturing cost and improving the display quality at the same time. In addition, how the shift register is divided and the details of the configuration of the driving circuit 11 is described later in detail.

Figure 2A:
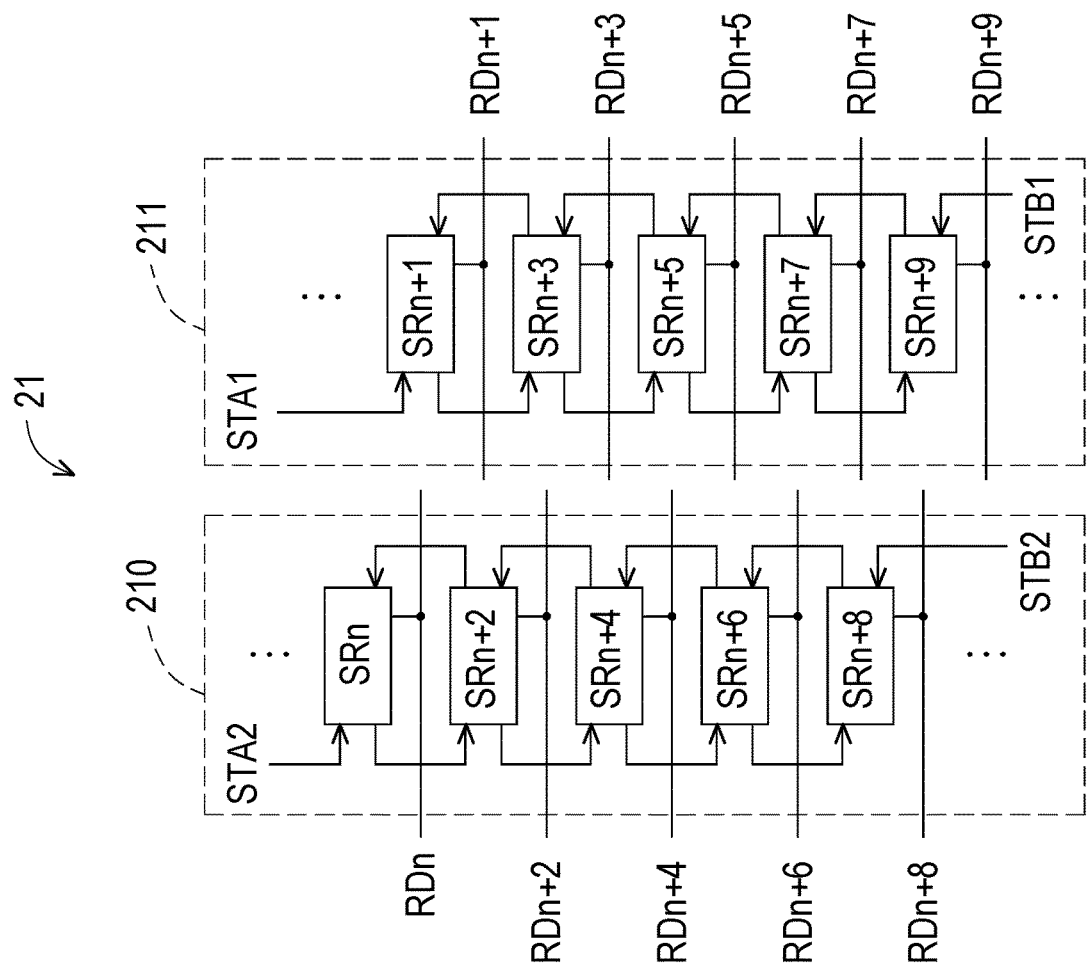
FIG. 2A is a circuit block diagram of a row driving circuit according to an embodiment of the disclosure.

FIG. 2A is a circuit block diagram of a row driving circuit 21 according to an embodiment of the disclosure. The row driving circuit 21 may be applied to the display panel 1 of FIG. 1 and configured to replace the row driving circuit 11 therein. In detail, the two strings 210 and 211 in the row driving circuit 21 are respectively configured to drive the even-numbered rows and the odd-numbered rows of the display array 10. The two strings 210 and 211 both include serially connected multi-stage shift registers, and each shift register may be configured to generate row driving signals to drive the corresponding rows of the display array 10. Therefore, the number of shift registers serially connected in the row driving circuit 21 may correspond to the number of rows of the display array 10. Although the two strings 210 and 211 are shown in FIG. 2A, the number of strings may of course be increased or decreased according to different product requirements, and all of them belong to the scope of variable embodiments of the row driving circuit 21.

For the convenience of description, only a portion of the row driving circuit 21 is shown in FIG. 2A, which corresponds to the nth to the n+9$^{th}$ rows of the display array, and those skilled in the art may certainly infer other portions of the row driving circuit 21 according to the content shown in FIG. 2A. In detail, the shift registers SRn, SRn+2, SRn+4, SRn+6, and SRn+8 in the string 210 are respectively coupled to the row driving lines RDn, RDn+2, RDn+4, RDn+6, and RDn+8, similarly, the shift registers SRn+1, SRn+3, SRn+5, SRn+7, and SRn+9 in the string 211 are respectively coupled to the row driving lines RDn+1, RDn+3, RDn+5, RDn+7, and RDn+9. Each shift register may be configured to generate a row driving signal to a corresponding row driving line.

More specifically, the shift registers serially connected in the strings 210 and 211 may receive the start signal, and each time the clock signal is driven, the start signal is sequentially transferred to the lower shift register device, thus generating sequentially enabled row driving signals. In this embodiment, the string 210 may receive the start signals STA2, STB2. The transfer direction of the string 210 may be controlled to transfer forward or backward. In this way, when the driving direction of the string 210 is controlled to drive backward, the string 210 may transfer the received start signal STA2 to the nth row, the n+2$^{nd}$ row, etc. in a backward manner. When the driving direction of the string 210 is controlled to drive forward, the string 210 may transfer the received start signal STB1 to the n+8th row, the n+6th row, etc. in a forward manner. Similarly, the string 211 may also be controlled in two transfer directions to transfer one of the start signals STA1 and STB1.

Figure 2B:
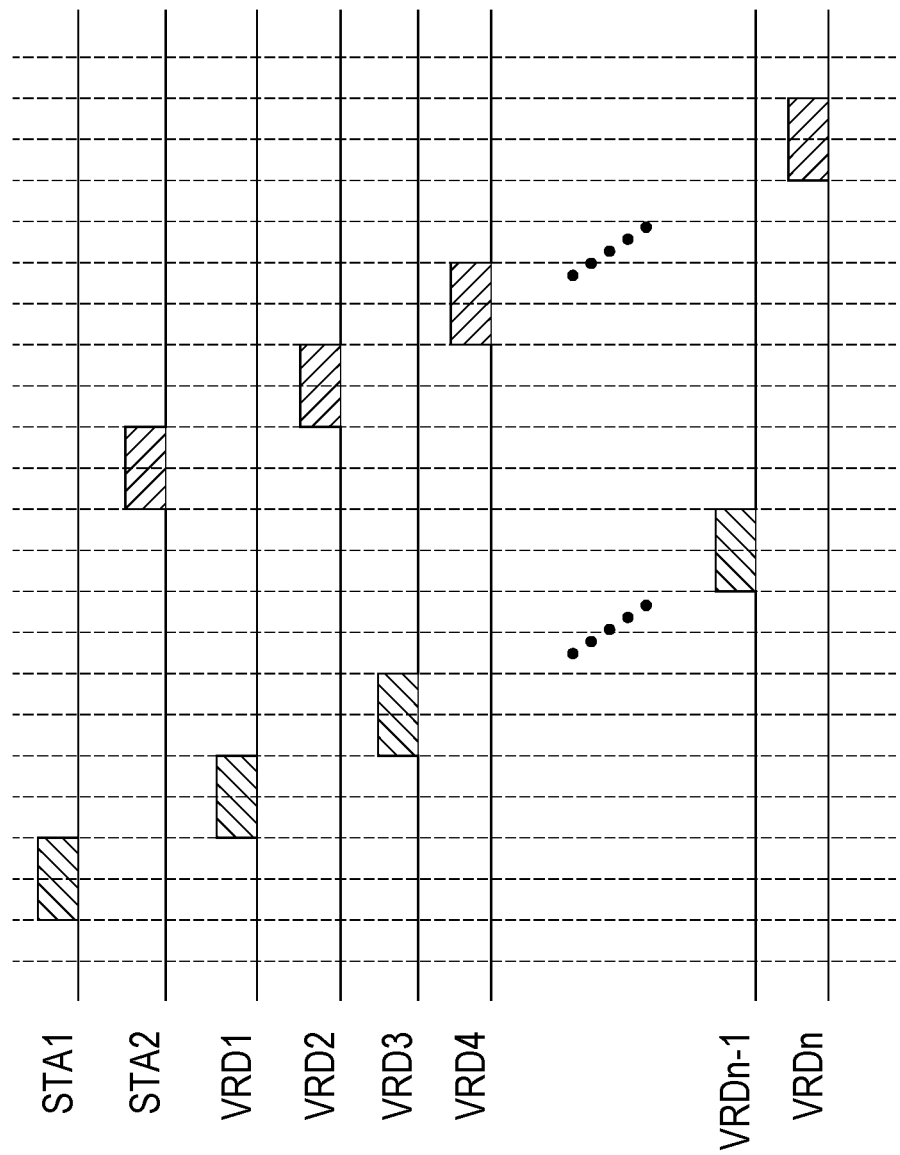
FIG. 2B is an operation waveform diagram of the row driving circuit in FIG. 2A.

FIG. 2B is an operation waveform diagram of the row driving circuit 21 in FIG. 2A. FIG. 2B shows start signals STA1 and STA2, and respective voltages VRD to VRDn on row driving lines RD to RDn. In this embodiment, the strings 210 and 211 in the row driving circuit 21 are set in the direction of backward transfer for respectively transferring the received start signals STA2 and STA1. In other embodiments, the strings 210 and 211 in the row driving circuit 21 may be set in other transfer directions, and even the transfer directions of the two strings 210 and 211 may be set to be the same or different transfer directions.

As shown in FIG. 2B, the start signals STA1 and STA2 may be, for example, pulse signals or square waves with a positive half cycle. As the start signal STA1 is provided to the string 211, the string 211 may sequentially provide the pulse of the start signal STA1 to the shift register of the subsequent stage (the subsequent odd row) in the subsequent operation cycle. More precisely, when shift register SRn+1 of the n+1$^{th}$ stage receives the pulse of the start signal STA1 transferred from the shift register SRn−1, in addition to providing the pulse of the start signal STA1 to the shift register SRn+3, the shift register SRn+1 of the n+1$^{th}$ stage may provide the pulse of the start signal STA1 to the corresponding row driving line RDn+1 at the same time, so that the voltage VRDn+1 changes accordingly. Then in the subsequent operation cycle, the same operation may be repeated by the shift register SRn+3, so that the pulse of the start signal STA1 is continuously transferred to the subsequent stage. After all the odd rows in the display array 10 are driven by the string 211, the start signal STA2 may be provided to the string 210, such that the string 210 drives the even rows of the display array 10.

Figure 3:
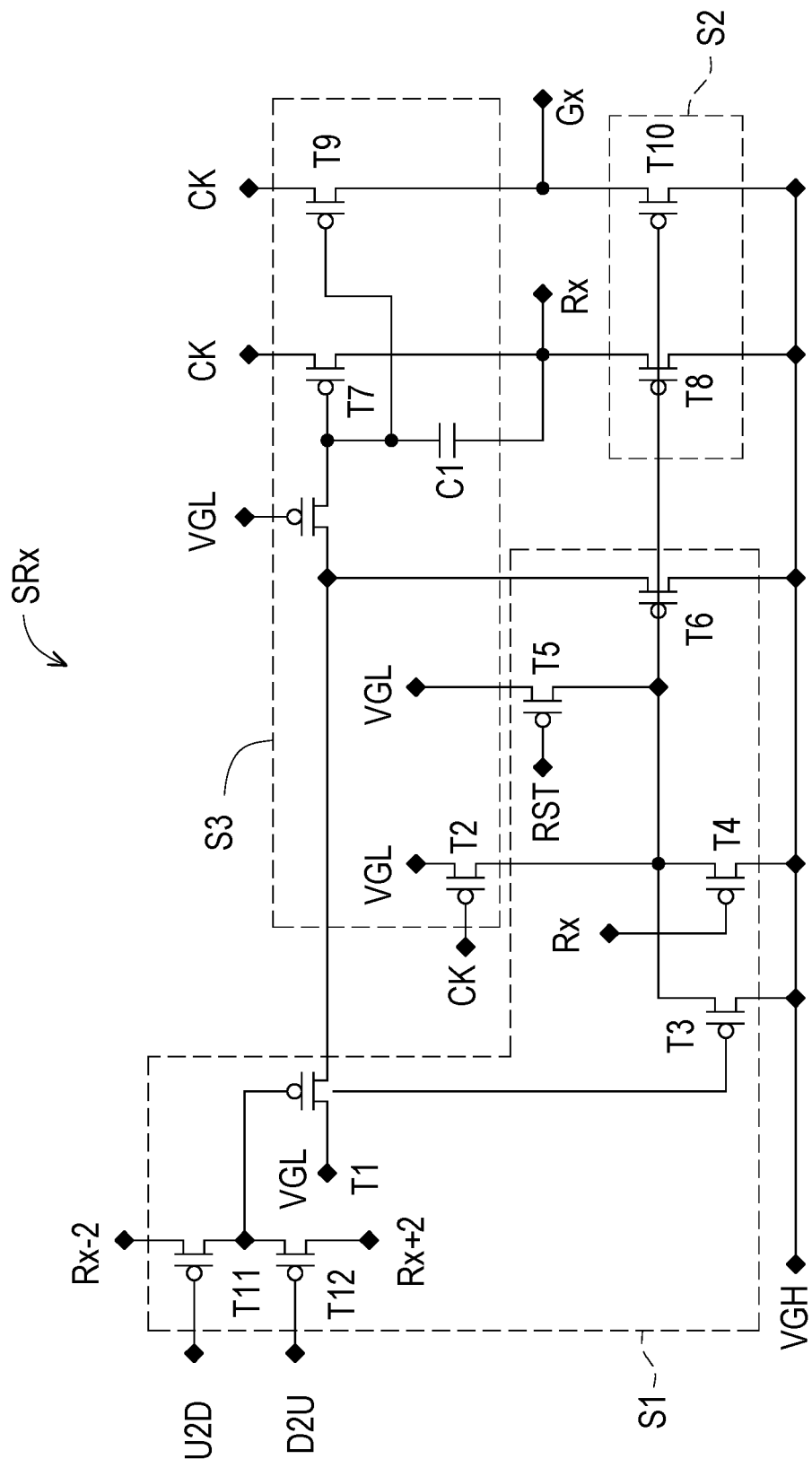
FIG. 3 is a circuit schematic diagram of a shift register according to an embodiment of the disclosure.

FIG. 3 is a circuit schematic diagram of a shift register SRx according to an embodiment of the disclosure. The shift register SRx includes transistors T1 to T12 and a capacitor C1. In this embodiment, the shift register SR is divided into three sub-circuits S1 to S3 according to the types of the coupled signal lines. The sub-circuit S1 may be coupled to global signal lines, which include power rails VGH and VGL, reset signal line RST, uplink control signal line D2U, and downlink control signal line U2D. For example, the power rails VGH and VGL may provide power to the display panel 1. The voltage on the reset signal line RST may be configured to control whether the shift register SRx is reset or not. The voltages on the uplink control signal line D2U and the downlink control signal line U2D may be configured together to control the direction in which the shift register SRx transfers the start signal, so as to determine whether the shift register SRx transfers the start signal to the previous stage (the previous odd/even row) or the subsequent stage (the subsequent odd/even row).

The elements in the sub-circuit S2 may be configured to stabilize the row driving signals Rx and Gx at the disabled voltage level at the appropriate time. Taking FIG. 3 as an example, this circuit structure is constructed with P-type transistors, so the disabled voltage level may be, for example, a relatively high voltage level on the power rail VGH, which is sufficient to cut off the P-type transistor. If an N-type transistor is taken as an example, the disabled voltage level may be, for example, a relatively low voltage level on the power rail VGL, which is sufficient to cutoff the N-type transistor. The sub-circuit S3 may be configured to receive the clock signal line CK and generate row driving signals Rx and Gx, and control the operation of the sub-circuit S2 at the same time.

Figure 4A:
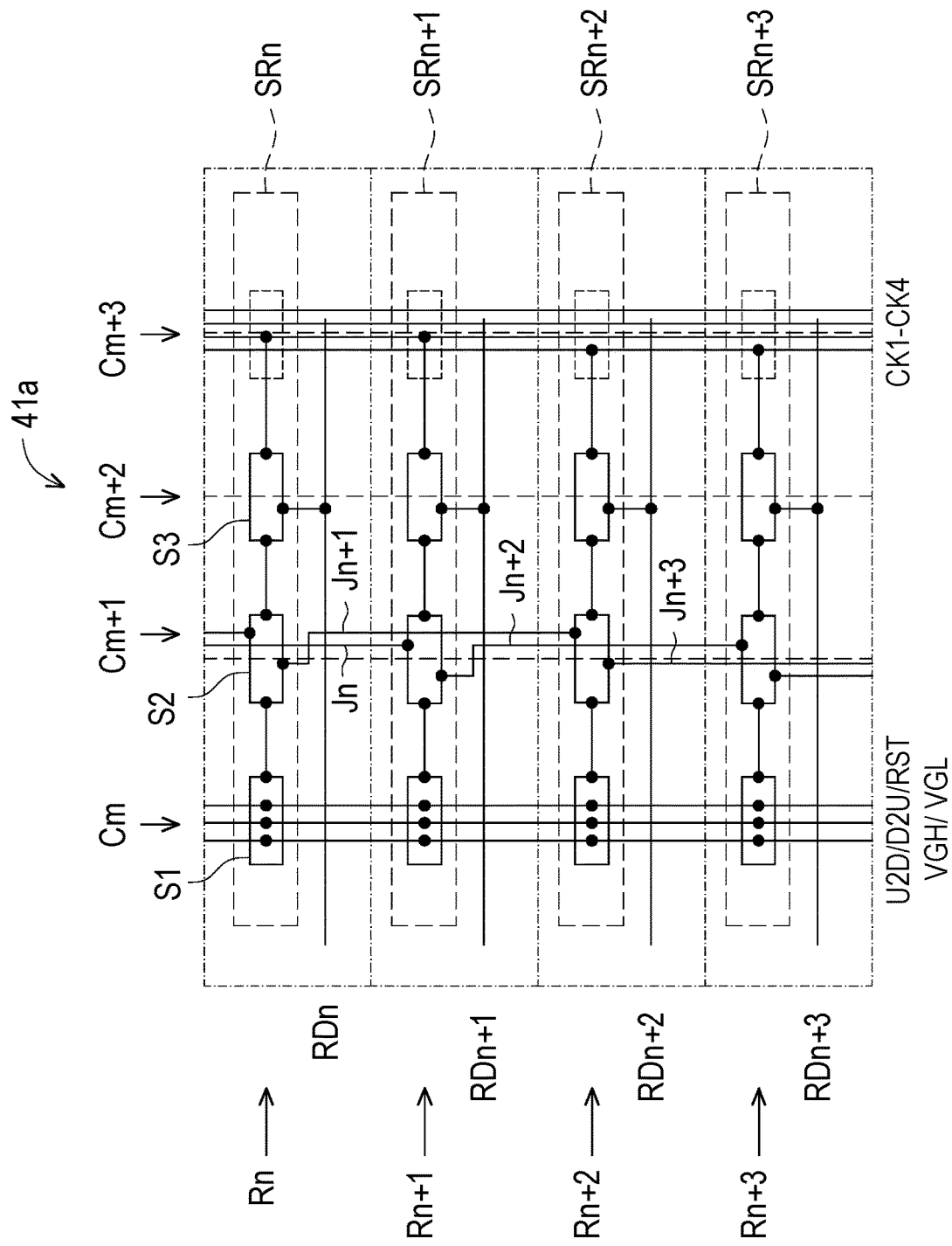
FIG. 4A is a layout schematic diagram of a row driving circuit according to an embodiment of the disclosure.

FIG. 4A is a layout schematic diagram of a row driving circuit 41a according to an embodiment of the disclosure. The row driving circuit 41a in FIG. 4A includes multi-stage shift registers serially connected, and each shift register in the row driving circuit 41a may be, for example, the shift register SRn shown in FIG. 3, and similarly divided into sub-circuits S1 to S3. In this embodiment, for the convenience of description, only a portion of the row driving circuit 41a is shown in FIG. 4A, which corresponds to the nth to n+3rd rows of the display array, and those skilled in the art may certainly infer other portions of the row driving circuit 41a according to the content shown in FIG. 4A.

As shown in FIG. 4A, in the m$^{th}$ column, the sub-circuits S1 of all the shift registers are disposed in the m$^{th}$ column, the sub-circuits S2 of all the shift registers are disposed in the m+1th column, and the sub-circuits S3 of all shift registers are disposed in the m+2$^{nd}$ column. In this way, referring to the contents of FIG. 3, it may be seen that since the transistors in the sub-circuit S1 are operated by receiving the power rails VGH and VGL, the reset signal line RST, the uplink control signal line D2U, and the downlink control signal line U2D, these global signal lines may be disposed in the same column Cm of the sub-circuit S1. In other words, the same global signal line does not need to be disposed repeatedly, effectively reducing hardware costs.

In the m+1th column, the row driving circuit 41a may also dispose all the jump signal lines in the m+1th column. In this embodiment, the number of rows spanned by each jump signal line is equal, so that the sub-circuit S2 of each shift register may provide the generated row driving signal to the shift registers of the previous stage and the subsequent stage through the jump signal lines. Specifically, the sub-circuit S3 may generate the row driving signal Rx for driving the shift registers of the previous stage and the subsequent stage. In this case, the row driving signal Rx may be provided to the shift registers of the previous stage and the subsequent stage through the jump signal lines. Taking the shift register SRn+1 in the n+1$^{th}$ row as an example, the sub-circuit S2 of the shift register SRn+1 may be coupled to the jump signal lines Jn and Jn+2, so that the row driving signal Rn+1 may be respectively provided to the shift registers SRn−1 and SRn+3 through the jump signal lines Jn and Jn+2.

In the m+$2^{nd}$ column, the row driving circuit 41a is disposed with the sub-circuit S3 of all the shift registers, which includes all the transistors in the shift registers controlled by the clock signal. In this way, the row driving circuit 41a may adaptively dispose all the clock signal lines CK1 to CK4 required by the shift register in the m+3rd column, thereby avoiding the requirement of repeatedly disposing the clock signal lines, and shortening the routing distance between the clock signal line and each transistor, effectively reducing the clock skew. For example, the sub-circuit S3 of the shift registers SRn and SRn+1 may be coupled to the clock signal line CK2, and the sub-circuit S3 of the shift registers SRn+2 and SRn+3 may be coupled to the clock signal line CK1.

On the other hand, the sub-circuit S3 disposed in the m+$2^{nd}$ column may be coupled to the respective row driving lines, so as to provide the row driving signal Gx generated by the shift register SRx in FIG. 3 to the corresponding row driving lines. For example, the sub-circuit S3 of the shift register SRn may be coupled to the row driving line RDn, and the sub-circuit S3 of the shift register SRn+1 may be coupled to the row driving line RDn+1, and so on.

Therefore, the row driving circuit 41a may divide the shift registers therein into two driving groups, which are respectively configured to drive the odd rows and the even rows. For the driving group driving the odd rows and the driving group driving the even rows, although the sub-circuit S2 is disposed together in the m+1th column, the shift registers of different groups are serially connected through the sub-circuit S2 to form separate strings.

In addition, although only the row driving circuit 41a is shown in FIG. 4A, the sub-circuits S1 to S3 in the row driving circuit 41a may also be disposed corresponding to the rows and columns of the display array 11. For example, the columns Cm to Cm+3 may be arranged in alignment with or staggered with the columns in the display array 11. Similarly, the rows Rn to Rn+3 may be arranged in alignment with or staggered with the rows in the display array 11.

On the other hand, grouping and disposing the transistors inside the row driving circuit 41a in corresponding columns according to the coupled signals may further reduce noise interference. Specifically, since the global signal lines are only disposed in the first column, the interference of the global signal lines to the sub-circuits arranged in other columns can be effectively reduced, thereby maintaining the stability of the row driving signals.

Figure 4B:
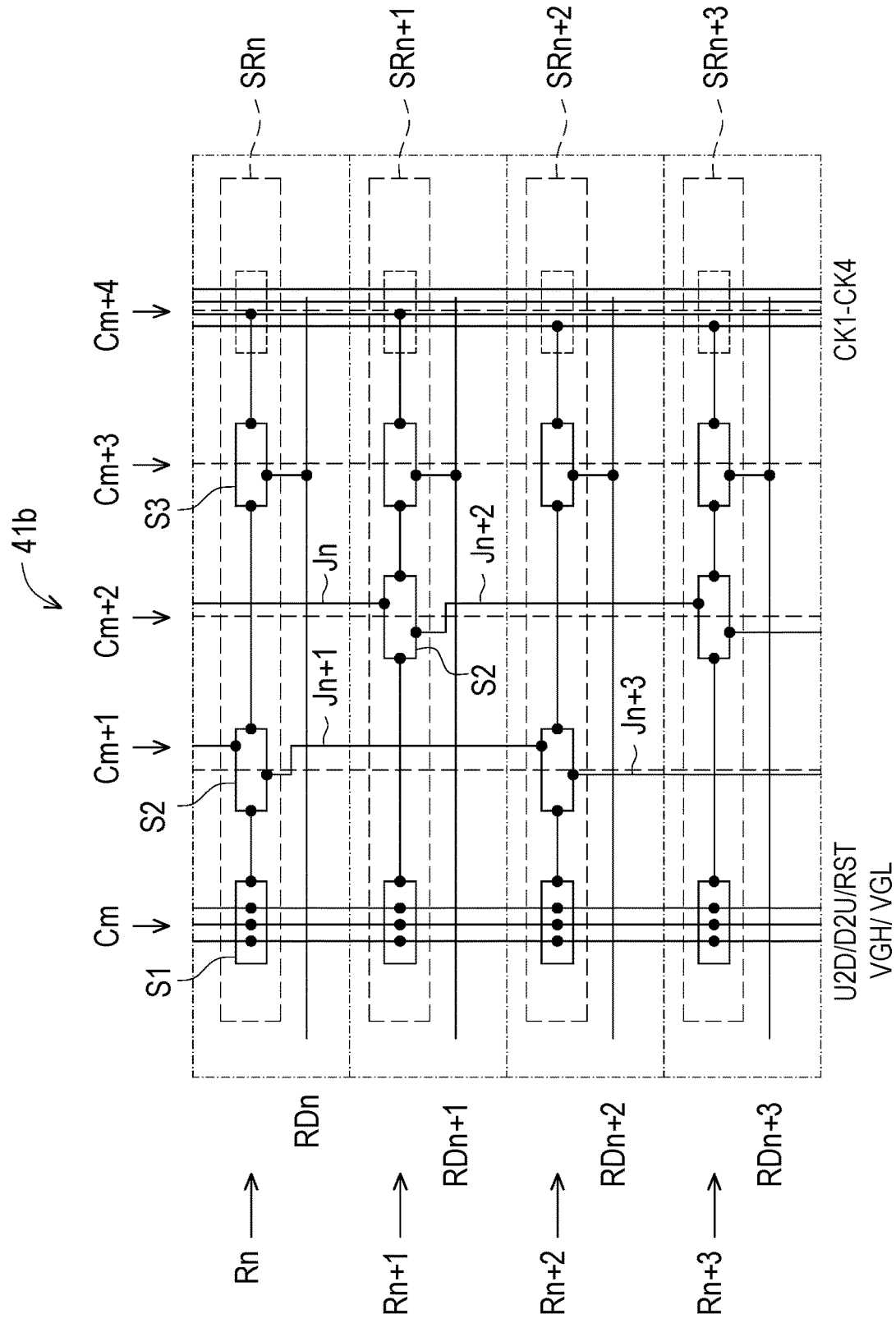
FIG. 4B is a layout schematic diagram of a row driving circuit according to an embodiment of the disclosure.

FIG. 4B is a layout schematic diagram of a row driving circuit 41b according to an embodiment of the disclosure. The row driving circuit 41b in FIG. 4B includes multi-stage shift registers serially connected, and each shift register in the row driving circuit 41b can be, for example, the shift register SRn shown in FIG. 3, and similarly divided into sub-circuits S1 to S3. In this embodiment, for the convenience of description, only a portion of the row driving circuit 41b is shown in FIG. 4B, which corresponds to the nth to n+3rd rows of the display array, and those skilled in the art can certainly infer other portions of the row driving circuit 41b according to the content shown in FIG. 4A.

The row driving circuit 41b in FIG. 4B is similar to the row driving circuit 41a in FIG. 4A, therefore, for the same elements and operations, refer to the above-mentioned paragraphs about FIG. 4A. The difference between the row driving circuit 41b of FIG. 4B and the row driving circuit 41a of FIG. 4A is that, in the row driving circuit 41b, the sub-circuit S2 configured to drive the driving group of the even columns is disposed in the m+1th column, and the sub-circuit S2 configured to drive the driving group of the odd columns is disposed in the m+$2^{nd}$ column. In addition, all the sub-circuits S3 are disposed in the m+3rd column, and the clock signal lines CK1 to CK4 are disposed in the m+$4^{th}$ column.

Specifically, the row driving circuit 41b can also be divided into a first driving group and a second driving group, respectively driving the even rows and the odd rows. The sub-circuit S2 of the first driving group may be disposed in the m+1th column. Through the sub-circuits S2 serially disposed in the m+1th column, the shift registers of the first driving group can form a string and be configured to drive the even rows in the display array 10. The sub-circuit S2 of the second driving group may be disposed in the m+$2^{nd}$ column. Through the sub-circuits S2 serially disposed in the m+$2^{nd}$ column, the shift registers of the second driving group can form another string and be configured to drive the odd rows in the display array 10. In this way, when the first driving group is enabled, the first driving group sequentially transfer the start signal to the shift register of the subsequent stage (the subsequent even row) through the jump signal line in the sub-circuit S2 by configuring the sub-circuit S3 in the m+1th column. Moreover, when the second driving group is enabled, the second driving group sequentially transfer the start signal to the shift register of the subsequent stage (the subsequent odd row) through the jump signal line in the sub-circuit S2 by configuring the sub-circuit S3 in the m+$2^{nd}$ column. Therefore, different groups of shift registers can be respectively configured to drive the odd and even rows of the display array through the sub-circuits S2 disposed in a staggered manner in the m+1th column and the m+$2^{nd}$ column.

To sum up, by appropriately grouping the internal circuits of the shift register, the transistors with the same coupling relationship in the internal circuit of the shift register are divided into the same sub-circuit. Further, the same sub-circuits may be disposed on the same column. In other words, in different shift registers, the transistors with the same coupling relationship are disposed on the same column, so that the sub-circuits on the same column can be connected through the same type of signal lines, so that these shift registers can use simpler and fewer lines and pins, reducing design complexity and saving manufacturing costs.

What is claimed is:

1. A display panel, comprising:
   a display array, disposed in an active region; and
   a plurality of shift registers, disposed in the active region, and configured to drive the display panel, wherein each of the shift registers is divided into a plurality of sub-circuits, each of the shift register comprises:
   a first sub-circuit, disposed in a first column of the display array, and all of the first sub-circuits disposed in the first column are coupled to at least one global signal line; and
   a second sub-circuit, disposed in a second column of the display array, and all of the second sub-circuits disposed in the second column are serially connected as at least one string through a plurality of jump signal lines, wherein each jump signal line is coupled between two of the second sub-circuits.

2. The display panel according to claim 1, wherein each of the shift registers further comprises a third sub-circuit, disposed in a third column of the display array, and the third sub-circuits are respectively coupled to a plurality of row driving signal lines of the display array.

3. The display panel according to claim 2, wherein a fourth column of the display array is also disposed with a plurality of clock signal lines extending along a column direction.

4. The display panel according to claim 1, wherein each of the jump signal lines spans at least one row of the display array.

5. The display panel according to claim 4, wherein the jump signal lines span a same number of rows.

6. The display panel according to claim 4, wherein the shift registers are divided into a plurality of driving groups, and the second sub-circuits of each of the driving groups are serially connected in each of the strings.

7. The display panel according to claim 4, wherein the shift registers are a plurality of first shift registers and form a first driving group, the display panel further comprises a plurality of second shift registers and form a second driving group, each of the second shift registers comprises:

a third sub-circuit, disposed in a third column of the display array, and the third sub-circuits of the second driving group are disposed in a staggered manner with the second sub-circuits of the first driving group.

8. The display panel according to claim 7, wherein the first driving group is serially connected through the second sub-circuits to form a first string, and the second driving group is serially connected through the third sub-circuits to form a second string.

9. The display panel according to claim 1, wherein when each of the strings is enabled, the shift registers of each of the strings are controlled to sequentially provide a plurality of row driving signals to the display array.

10. The display panel according to claim 1, wherein the at least one global signal line comprises one of a power trail, a reset signal line, an uplink control signal line and a downlink control signal line.

* * * * *